(12) United States Patent
Karunasiri et al.

(10) Patent No.: US 9,594,172 B1
(45) Date of Patent: Mar. 14, 2017

(54) SOLID-STATE SPARK CHAMBER FOR DETECTION OF RADIATION

(71) Applicant: The United States of America, as represented by the Secretary of the Navy, Washington, DC (US)

(72) Inventors: Gamani Karunasiri, Pacific Grove, CA (US); Fabio Durante Pereira Alves, Monterey, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 442 days.

(21) Appl. No.: 14/480,220

(22) Filed: Sep. 8, 2014

Related U.S. Application Data

(60) Provisional application No. 61/875,533, filed on Sep. 9, 2013.

(51) Int. Cl.
*G01T 1/178* (2006.01)
*G01T 1/24* (2006.01)
(Continued)

(52) U.S. Cl.
CPC .......... *G01T 1/24* (2013.01); *H01L 29/66371* (2013.01); *H01L 29/66401* (2013.01); *H01L 29/7408* (2013.01); *H01L 29/7412* (2013.01)

(58) Field of Classification Search
CPC .. G01T 1/178; G06F 11/1008; G06F 11/0793; G11C 11/417
(Continued)

(56) References Cited

U.S. PATENT DOCUMENTS

| | | | |
|---|---|---|---|
| 4,687,622 A * | 8/1987 | Longden | G01T 1/026 376/254 |
| 5,097,446 A * | 3/1992 | Shoji | G11C 16/32 365/185.11 |

(Continued)

OTHER PUBLICATIONS

Alessandro Gabrielli, Particle Detector Prototype Based on a Discrete Cell Sensitive to the Latchup Effect, Meas. Sci. Technol., Jul. 13, 2006, p. 2269-2273, vol. 17.
(Continued)

*Primary Examiner* — David Porta
*Assistant Examiner* — Djura Malevic
(74) *Attorney, Agent, or Firm* — Naval Postgraduate School; Lisa A. Norris

(57) ABSTRACT

A combined semiconductor controlled circuit (CSCC) includes a semiconductor controlled switch (SCS). The SCS includes anode, cathode, anode gate and cathode gate terminals connected to $P_1$ anode, $N_2$ cathode, $N_1$ anode gate and $P_2$ cathode gate layers. The SCS also includes P-N junctions between $P_1$ anode and $N_1$ anode gate layers, $N_1$ anode gate and $P_2$ cathode gate layers and $P_2$ cathode gate and $N_2$ cathode layers. The CSCC also includes a Zener diode having a current path flowing from the cathode terminal to the anode gate terminal, a feedback resistor connecting cathode and cathode gate terminals and a substrate. A solid-state spark chamber includes a CSCC, a DC bias voltage source and an RC load having a parallel-connected load resistor and capacitor. The solid-state spark chamber also includes a plurality of measurement terminals and a ground. A method of making a solid-state spark chamber includes connecting the above components.

20 Claims, 4 Drawing Sheets

(51) Int. Cl.
*H01L 29/74* (2006.01)
*H01L 29/66* (2006.01)

(58) Field of Classification Search
USPC .................................. 250/370.01, 370.02
See application file for complete search history.

(56) References Cited

U.S. PATENT DOCUMENTS

| | | | | |
|---|---|---|---|---|
| 5,391,951 | A * | 2/1995 | Guenther | H01L 29/7436 257/E27.105 |
| 5,392,186 | A * | 2/1995 | Alexander | H03K 17/08104 361/118 |
| RE35,836 | E * | 7/1998 | Rodriguez | H01L 31/167 250/551 |
| 5,821,572 | A * | 10/1998 | Walker | H01L 27/0262 257/107 |
| 5,889,313 | A | 3/1999 | Parker | |
| 5,982,600 | A * | 11/1999 | Cheng | H01L 21/8238 257/355 |
| 6,479,826 | B1 | 11/2002 | Klann et al. | |
| 6,605,493 | B1 * | 8/2003 | Yu | H01L 29/7436 257/133 |
| 6,642,088 | B1 * | 11/2003 | Yu | H01L 21/76264 257/E21.564 |
| 6,674,129 | B1 * | 1/2004 | Colclaser | H01L 27/0255 257/355 |
| 6,720,622 | B1 * | 4/2004 | Yu | H01L 29/7436 257/173 |
| 6,768,616 | B2 * | 7/2004 | Mergens | H01L 27/0251 257/355 |
| 7,154,724 | B2 * | 12/2006 | Wu | H01L 27/0262 257/355 |
| 7,221,027 | B2 * | 5/2007 | Lin | H01L 27/0255 257/355 |
| 7,291,887 | B2 * | 11/2007 | Chiu | H01L 27/0251 257/355 |
| 7,550,730 | B1 * | 6/2009 | Cannon | G01T 1/245 250/370.02 |
| 7,687,780 | B2 | 3/2010 | Bell et al. | |
| 7,728,349 | B2 * | 6/2010 | Boselli | H01L 27/0262 257/107 |
| 7,855,372 | B2 | 12/2010 | McGregor et al. | |
| 7,993,956 | B2 * | 8/2011 | Shiu | H01L 31/103 257/458 |
| 8,633,543 | B2 * | 1/2014 | Ohta | H01L 27/0262 257/127 |
| 8,638,135 | B2 * | 1/2014 | Camarena | H03K 19/00315 327/142 |
| 8,815,654 | B2 * | 8/2014 | Gauthier, Jr. | H01L 27/0262 257/107 |
| 9,201,726 | B2 * | 12/2015 | Morris | G06F 11/0793 |
| 2002/0020880 | A1 * | 2/2002 | Yu | H01L 27/0255 257/360 |
| 2003/0042498 | A1 * | 3/2003 | Ker | H01L 27/0262 257/173 |
| 2003/0076636 | A1 * | 4/2003 | Ker | H01L 27/0262 361/56 |
| 2003/0107406 | A1 * | 6/2003 | Li | H03K 19/00315 326/83 |
| 2003/0179523 | A1 * | 9/2003 | Kodama | H01L 27/0262 361/56 |
| 2003/0205761 | A1 * | 11/2003 | Chang | H01L 27/0262 257/355 |
| 2004/0136127 | A1 * | 7/2004 | Kodama | H01L 27/0262 361/56 |
| 2004/0217425 | A1 * | 11/2004 | Brodsky | H01L 27/0248 257/360 |
| 2005/0286295 | A1 * | 12/2005 | Kapre | G11C 5/14 365/177 |
| 2009/0213677 | A1 * | 8/2009 | Kapre | G11C 5/14 365/226 |
| 2010/0327171 | A1 | 12/2010 | Robinson et al. | |
| 2012/0075757 | A1 * | 3/2012 | Chen | H01L 27/0285 361/56 |
| 2013/0200428 | A1 * | 8/2013 | Rountree | H01L 27/0262 257/146 |
| 2014/0167099 | A1 * | 6/2014 | Mergens | H01L 29/87 257/109 |
| 2014/0211547 | A1 * | 7/2014 | Kapre | G11C 5/14 365/154 |
| 2014/0339608 | A1 * | 11/2014 | Rountree | H01L 27/0266 257/268 |

OTHER PUBLICATIONS

Alessandro Gabrielli et al., A Latchup Topology to Investigate Novel Particle Detectors, TWEPP-09: Topical Workshop on Electronics for Particle Physics, 2009, p. 318-320, Paris.

* cited by examiner

SOLID-STATE SPARK CHAMBER FOR DETECTION OF RADIATION

CROSS-REFERENCE TO RELATED PATENT APPLICATIONS

This application is a non-provisional application of and claims priority to U.S. Patent Application 61/875,533, filed on Sep. 9, 2013, which is hereby incorporated by reference in its entirety.

BACKGROUND OF THE INVENTION

1. Field of the Invention

This invention relates to the field of radiant energy, and more specifically, to semiconductor systems for invisible radiant energy responsive electric signaling.

2. Description of the Related Art

Radiation detectors are vital to both scientific research and national security. In scientific research, radiation detectors allow precise monitoring of nuclear decay, cosmic radiation or reactions in a particle accelerator. National security applications include detection of smuggled nuclear material or nuclear weapons.

Solid-state spark chambers, also known as semiconductor radiation detectors, are both compact and easily used. Exposing a semiconductor to radiation produces free electrons and holes in the semiconductor. The existence of these electron-hole pairs indicates the presence of radiation, while the number of electron-hole pairs is proportional to the energy of the radiation. Under the influence of an electric field, the electrons and holes travel to electrodes on either side of the semiconductor radiation detector, resulting in a measurable voltage pulse $V_P$.

Efforts have been made in to the prior art to enhance the quality and expand the utility of solid-state spark chambers. These efforts have been limited to modification of the composition and structure of the semiconductor.

SUMMARY OF THE INVENTION

In accordance with one embodiment, a combined semiconductor controlled circuit (CSCC) for detection of radiation includes a semiconductor controlled switch (SCS). The SCS includes an anode terminal connected to a $P_1$ anode layer, a cathode terminal connected to an $N_2$ cathode layer, an anode gate terminal connected to an $N_1$ anode gate layer and a cathode gate terminal connected to a $P_2$ cathode gate layer. The SCS also includes a first P-N junction between the $P_1$ anode layer and the $N_1$ anode gate layer, a second P-N junction between the $N_1$ anode gate layer and the $P_2$ cathode gate layer and a third P-N junction between the $P_2$ cathode gate layer and the $N_2$ cathode layer. The CSCC also includes a Zener diode having a path of current. The Zener diode connects the cathode terminal and the anode gate terminal. The path of current flows from the cathode terminal to the anode gate terminal. The CSCC also includes a feedback resistor connecting the cathode terminal and the cathode gate terminal. The CSCC also includes a substrate.

In accordance with another embodiment, a solid-state spark chamber for detection of radiation includes a CSCC, a DC bias voltage source having a first bias terminal and a second bias terminal, and an RC load having a first load terminal and a second load terminal. The RC load includes a load resistor and a load capacitor connected in parallel. The solid-state spark chamber also includes a plurality of measurement terminals and a ground. The first bias terminal connects to an anode terminal of the CSCC and the second bias terminal connects to the ground. The first load terminal connects to a cathode terminal of the CSCC and to at least one of the plurality of measurement terminals. The second load terminal connects to the ground and to another of the plurality of measurement terminals.

In accordance with another embodiment, a method of making a solid-state spark chamber for detection of radiation includes connecting an anode terminal of a CSCC to a first bias terminal of a DC bias voltage source and connecting a second bias terminal of the DC bias voltage source to a ground. The method also includes connecting a load resistor and a load capacitor in parallel to form an RC load, connecting a first load terminal of the RC load to a cathode terminal of a CSCC, connecting the first load terminal of the RC load to one of a plurality of measurement terminals, connecting a second load terminal of the RC load to the ground and connecting the second load terminal of the RC load to another of the plurality of measurement terminals.

DETAILED DESCRIPTION OF INVENTION

Figure 1:
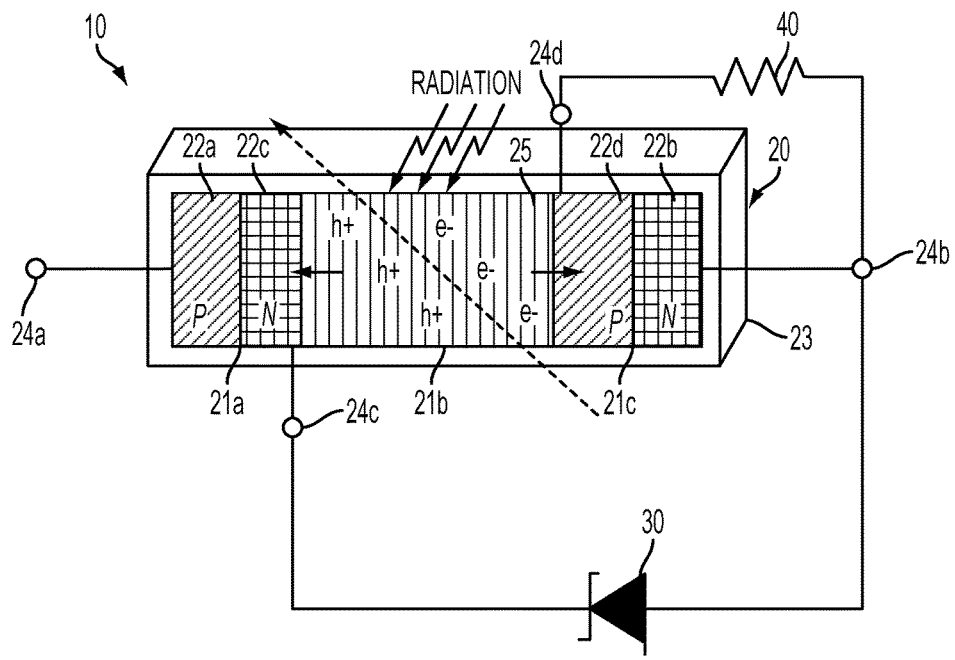
FIG. 1 illustrates a diagram of a CSCC in accordance with one embodiment of the invention.

FIG. 1 illustrates a diagram of a CSCC 10 in accordance with one embodiment of the invention. CSCC 10 includes a SCS 20, a Zener diode 30 and a feedback resistor 40.

SCS 20 includes a first P-N junction 21a, a second P-N junction 21b and a third P-N junction 21c. As used herein, the term "P" means a semiconductor having a larger hole concentration than electron concentration. As used herein, the term "N" means a semiconductor having a larger electron concentration than hole concentration. SCS 20 can switch from a high impedance state, also known as forward blocking mode, to a low impedance state, also known as a conduction mode.

SCS 20 has a $P_1$ anode layer 22a connected to an anode terminal 24a and an $N_2$ cathode layer 22b connected to a cathode terminal 24b. SCS 20 also includes an $N_1$ anode gate layer 22c connected to an anode gate terminal 24c and a $P_2$ cathode gate layer 22d connected to a cathode gate terminal 24d. SCS 20 also includes a substrate 23. In one embodiment, $N_1$ anode gate layer 22c and $P_2$ cathode gate layer 22d form a radiation interface 25. During use, direct exposure of radiation interface 25 to the surrounding atmosphere permits detection of radiation.

First P-N junction 21a is the interface between $P_1$ anode layer 22a and $N_1$ anode gate layer 22c. Second P-N junction 21b is the interface between $N_1$ anode gate layer 22c and $P_2$ cathode gate layer 22d. Third P-N junction 21c is the interface between P$_2$ cathode gate layer 22d and N$_2$ cathode layer 22b.

Under low bias conditions, first P-N junction 21a and third P-N junction 21c are forward biased while second P-N junction 21b is reversed. SCS 20 is in forward blocking mode and second P-N junction 21b holds most of the voltage drop across SCS 20. When the bias increases, injected carriers from first P-N junction 21a and third P-N junction 21c collect in N$_1$ anode gate layer 22c and P$_2$ cathode gate layer 22d. The accumulation of charges reduces the potential drop within second P-N junction 21b, eventually forcing second P-N junction 21b to forward bias. The same effect occurs when injecting charges with correct polarity via anode gate terminal 24c and cathode gate terminal 24d. With first P-N junction 21a, second P-N junction 21b and third P-N junction 21c forward biased, SCS 20 switches to conduction mode.

Switching time τ, the time required for SCS 20 to transition from forward blocking to conduction mode, is so low as to be essentially instantaneous. SCS 20 switches off when the current through SCS 20 falls below a holding current I$_H$, the minimum current traveling from anode terminal 24a to cathode terminal 24b when SCS 20 is in conduction mode. Switching voltage V$_S$ is the voltage between anode terminal 24a and cathode terminal 24b when SCS 20 is about to switch from forward blocking to conduction mode. Switching voltage V$_S$ depends on the thicknesses and doping concentrations of P$_1$ anode layer 22a, N$_2$ cathode layer 22b, N$_1$ anode gate layer 22c and P$_2$ cathode gate layer 22d.

Switching voltage V$_S$ can be controlled externally by anode gate current I$_{AG}$, current injected to anode gate terminal 24c or cathode gate current I$_{CG}$, current injected to cathode gate 24b. An increase in anode gate current I$_{AG}$ will increase switching voltage V$_S$ while an increase in cathode gate current I$_{CG}$ will decrease switching voltage V$_S$.

In one embodiment, using Zener diode 30 and feedback resistor 40 enables control of the transition characteristics of SCS 10. Zener diode 30 connects cathode terminal 24b and anode gate terminal 24c. Feedback resistor 40 connects cathode terminal 24b and cathode gate terminal 24d.

Zener diode 30 connects cathode terminal 24b and anode gate terminal 24c to inject anode gate current I$_{AG}$ and set switching voltage V$_S$. For Zener diode 30, the path of anode gate current I$_{AG}$ flows from cathode terminal 24b to anode gate terminal 24c. In various embodiments, Zener diode 30 may be a diode with a quantum tunneling breakdown mechanism, a diode with an avalanche breakdown mechanism or a diode with a combination of the quantum tunneling and avalanche breakdown mechanisms.

Feedback resistor 40 connects cathode terminal 24b and cathode gate terminal 24d to set switching current I$_S$ and holding current I$_H$. Switching current I$_S$ is the current traveling from anode terminal 24a to cathode terminal 24b when SCS 20 is about to switch from forward blocking to conduction mode. Lowering switching voltage V$_S$ or holding current I$_H$ makes SCS 10 switch its state with only a small amount of charge injected to anode gate terminal 24c. This increases sensitivity to radiation.

Figure 2A:
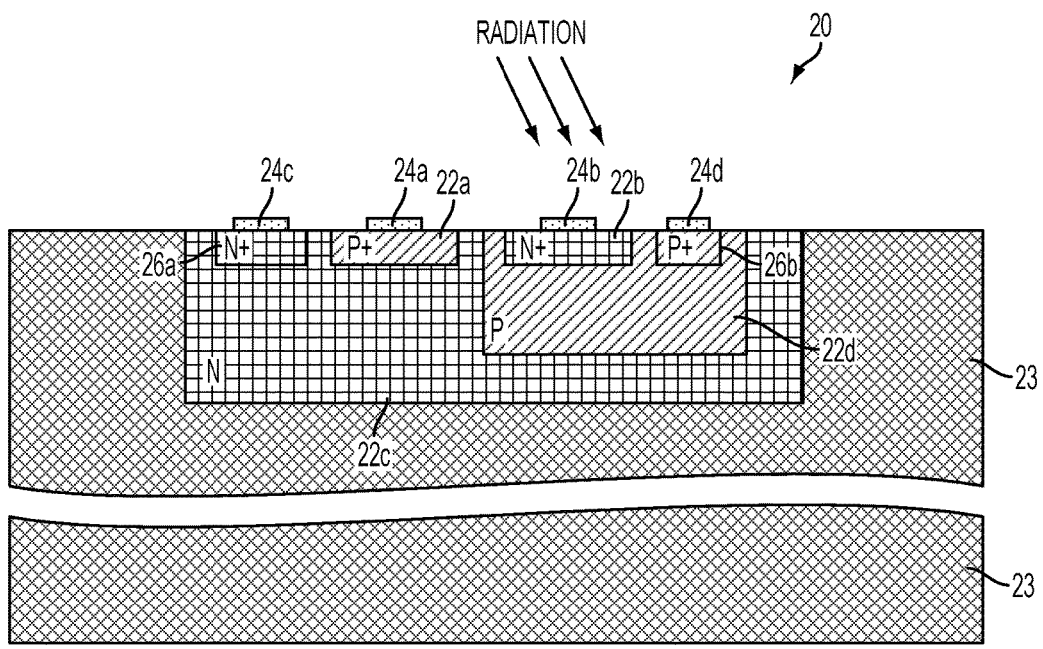
FIG. 2a illustrates a diagram of a SCS in accordance with one embodiment of the invention.
Figure 2B:
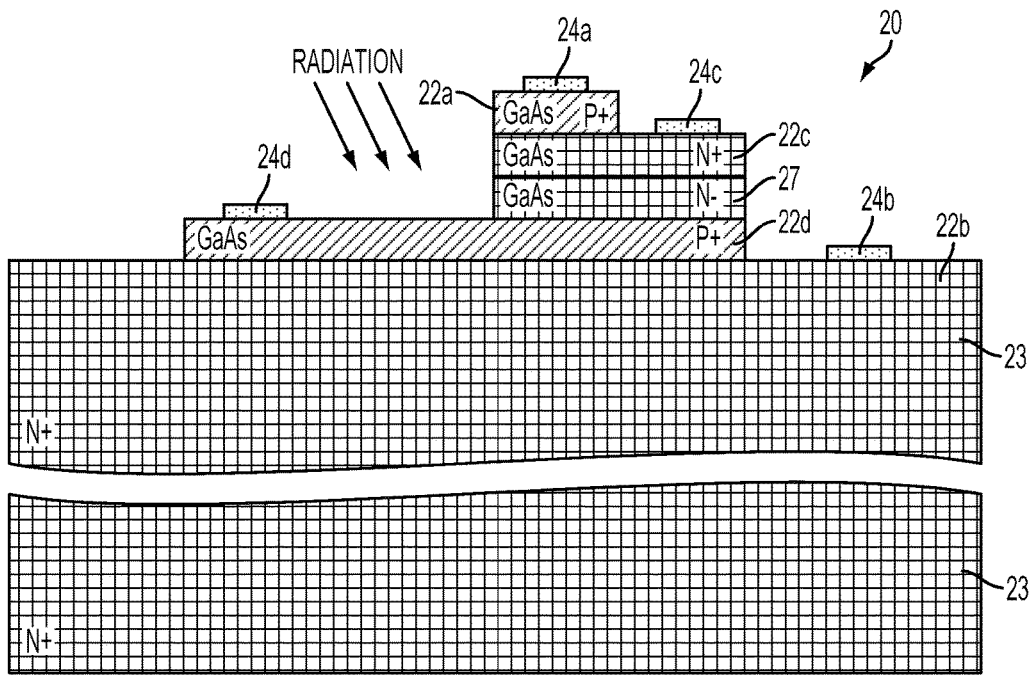
FIG. 2b illustrates a diagram of a SCS in accordance with one embodiment of the invention.
Figure 2C:
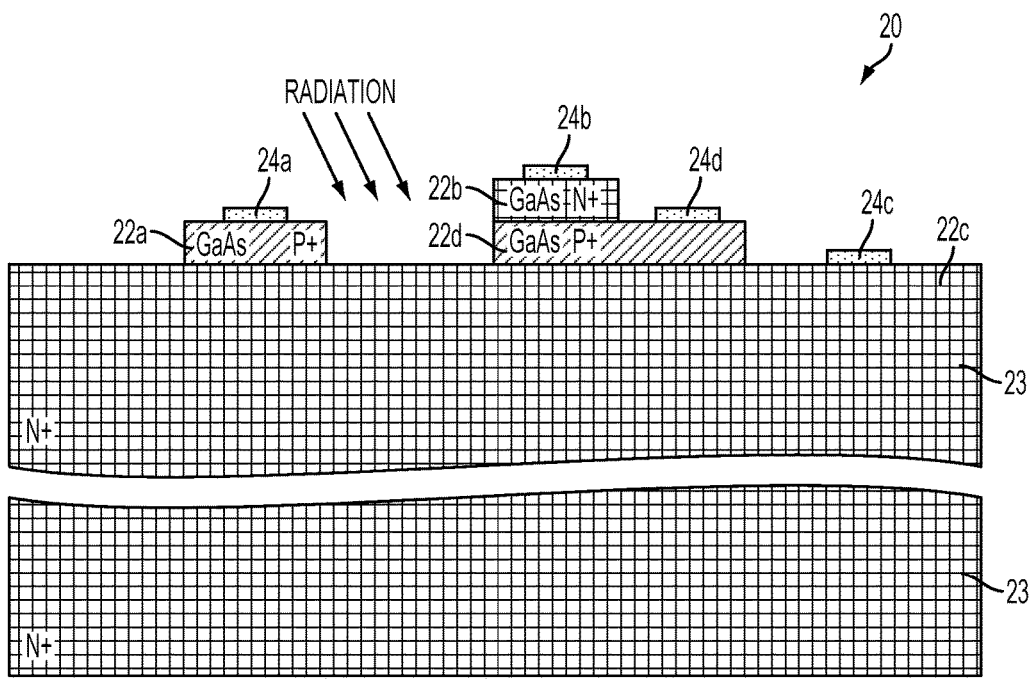
FIG. 2c illustrates a diagram of a SCS in accordance with one embodiment of the invention.

Various embodiments of CSCC 10 incorporate various embodiments of SCS 20. These various embodiments of SCS 20 may be optimized to function in CSCC 10. FIGS. 2a-2c illustrate these various embodiments of SCS 20.

FIG. 2a illustrates a diagram of SCS 20 in accordance with one embodiment of the invention. In the embodiment of FIG. 2a, P$_1$ anode layer 22a is a P+ region inside of a N well, while N$_2$ cathode layer 22b is a N+ region inside of a P region inside of the previously mentioned N well. As used herein, the term "well" indicates a semiconductor region fabricated to form a physical barrier between a substrate and one or more semiconductor regions. As used herein, the designation "+" indicates a semiconductor, either P or N, having a high doping concentration. As previously mentioned, P$_1$ anode layer 22a connects to anode terminal 24a and N$_2$ cathode layer 22b connects to cathode terminal 24b. N$_1$ anode gate layer 22c is the previously mentioned N well and P$_2$ cathode gate layer 22d is the previously mentioned P region. N$_1$ anode gate layer 22c also includes an N+ contact region 26a that contacts anode gate terminal 24c. P$_2$ cathode gate layer 22d also includes a P+ contact region 26b that contacts cathode gate terminal 24d. Substrate 23 is a silicon substrate. This configuration is based on standard CMOS processing technology. During use, radiation exposure typically occurs in second P-N junction 21b.

FIG. 2b illustrates a diagram of SCS 20 in accordance with one embodiment of the invention. In the embodiment of FIG. 2b, P$_1$ anode layer 22a is a P+ gallium arsenide (GaAs) layer, while N$_2$ cathode layer 22b is substrate 23, an N-doped GaAs substrate. N$_1$ anode gate layer 22c is an N+ GaAs layer and P$_2$ cathode gate layer 22d is a P+ GaAs layer in direct contact with substrate 23. As previously mentioned, P$_1$ anode layer 22a connects to anode terminal 24a, N$_2$ cathode layer 22b connects to cathode terminal 24b, N$_1$ anode gate layer 22c connects to anode gate terminal 24c and P$_2$ cathode gate layer 22d connects to cathode gate terminal 24d. Substrate 23 is an N-doped GaAs substrate. During use, radiation exposure typically occurs in P$_2$ cathode gate layer 22d. The embodiment of FIG. 2b also includes a control layer 27 located between N$_1$ anode gate layer 22c and P$_2$ cathode gate layer 22d. Control layer 27 is an N− GaAs layer. As used herein, the designation "−" indicates a semiconductor, either P or N, having a low doping concentration. Control layer 27 allows further control of the current and voltage characteristics of SCS 20.

FIG. 2c illustrates a diagram of SCS 20 in accordance with one embodiment of the invention. In the embodiment of FIG. 2c, P$_1$ anode layer 22a is a P+ GaAs layer in direct contact with substrate 23, while N$_2$ cathode layer 22b is an N+ GaAs layer. N$_1$ anode gate layer 22c is substrate 23, an N-doped GaAs substrate and P$_2$ cathode gate layer 22d is a P+ GaAs layer in direct contact with substrate 23. As previously mentioned, P$_1$ anode layer 22a connects to anode terminal 24a, N$_2$ cathode layer 22b connects to cathode terminal 24b, N$_1$ anode gate layer 22c connects to anode gate terminal 24c and P$_2$ cathode gate layer 22d connects to cathode gate terminal 24d. Substrate 23 is an N-doped GaAs substrate. During use, radiation exposure typically occurs in substrate 23, allowing a larger area for radiation detection.

Figure 3:
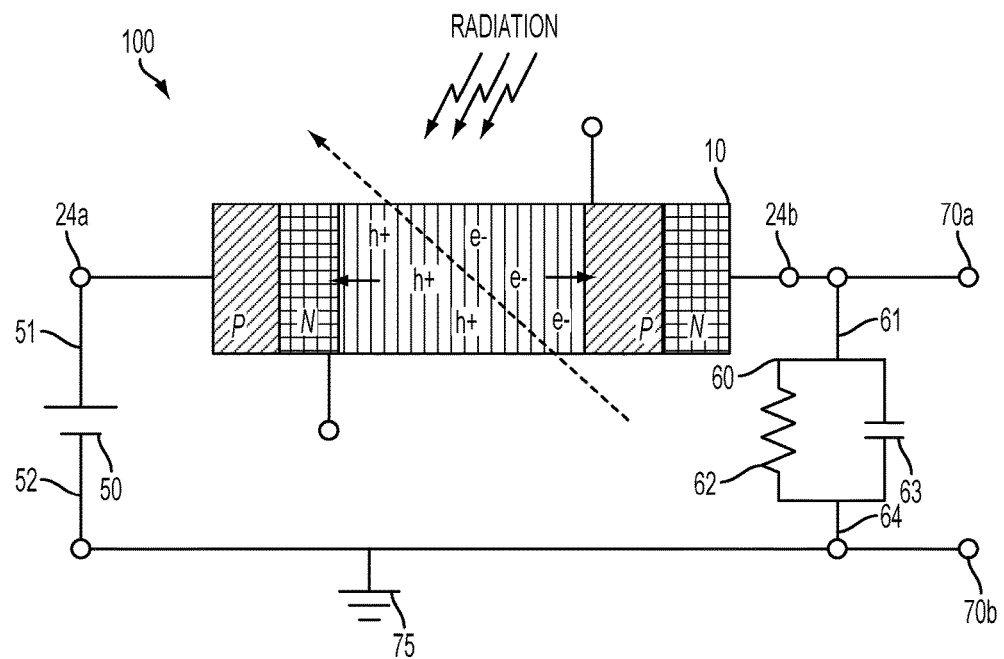
FIG. 3 illustrates a circuit diagram of a solid-state spark chamber in accordance with one embodiment of the invention.

FIG. 3 illustrates a circuit diagram of a solid-state spark chamber 100 in accordance with one embodiment of the invention. Solid-state spark chamber 100 includes CSCC 10, a DC bias voltage source 50, an RC load 60, a plurality of measurement terminals 70a and 70b and a ground 75.

DC bias voltage source 50 connects to anode terminal 24a at a first bias terminal 51 and to ground 75 at a second bias terminal 52. DC bias voltage source 50 provides a bias voltage V$_B$, a steady-state voltage, with a maximum voltage level V$_{BM}$ given by the equation $$V_{BM} = V_S + (I_S * R_L)$$

where R$_L$ is a load resistance of RC load 60. The increase of bias voltage V$_B$ towards maximum voltage level V$_{BM}$ will increase the sensitivity of solid-state spark chamber 100 to radiation.

RC load 60 connects to cathode terminal 24b at a first load terminal 61 and to ground 75 at a second load terminal 64. RC load 60 includes a load resistor 62 and a load capacitor 63 connected in parallel.

Load resistor 62 has load resistance $R_L$ range determined by the expression $$\frac{V_B - V_S}{I_S} > R_L > \frac{V_B - V_H}{I_H}$$

where $V_H$ is a holding voltage, the minimum voltage between anode terminal 24a and cathode terminal 24b when SCS 20 is in conduction mode.

Load capacitor 63 has a load capacitance $C_L$ resulting in an impedance of approximately 1 ohm. Load capacitance $C_L$ is determined by the equation $$1 \sim \frac{\tau}{2\pi C_L}$$

Measurement terminals 70a and 70b connect to first load terminal 61 and second load terminal 64, respectively. An output voltage $V_O$ measured across measurement terminals 70a and 70b provides voltage pulse $V_P$ corresponding to detection of radiation. Voltage pulse $V_P$ is a pulse with a base level given by the equation $$V_P = V_B - I_S * R_L$$

Altering bias voltage $V_B$ controls the rate of voltage pulses $V_P$. In addition, sending a current via anode gate terminal 24c or cathode gate terminal 24d can also control the rate of voltage pulses $V_P$.

Figure 4:
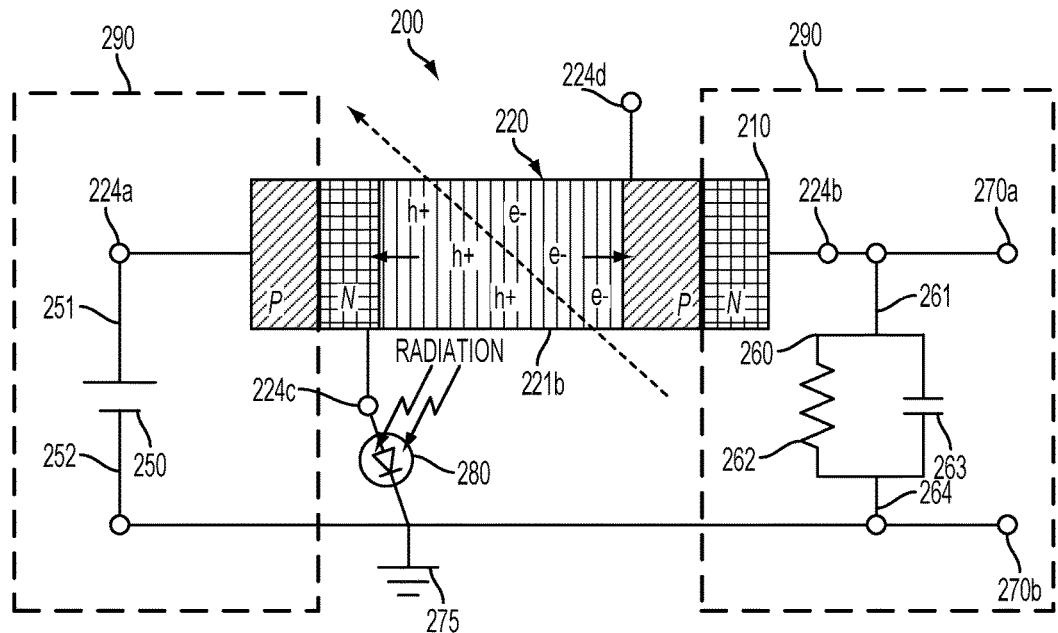
FIG. 4 illustrates a circuit diagram of a solid-state spark chamber in accordance with one embodiment of the invention.

FIG. 4 illustrates a circuit diagram of a solid-state spark chamber 200 in accordance with one embodiment of the invention. The configurations, components and functions of CSCC 210, DC bias voltage source 250, RC load 260, measurement terminals 270a and 270b and ground 275 of FIG. 4 are substantially identical in form and function to their counterparts in the embodiment illustrated in FIG. 3.

The embodiment of FIG. 4 also includes a photodetector 280 and optional radiation shielding 290. Connecting photodetector 280 between cathode gate terminal 224d and ground 275 increases the volume of solid-state spark chamber 200 exposed to radiation, thereby increasing the sensitivity of solid-state spark chamber 200. Injecting a charge generated by exposing photodetector 280 to radiation into second P-N junction 221b emulates an expansion of the volume of SCS 220.

In the embodiment of FIG. 4, photodetector 280 is a silicon p-i-n diode. As used herein, the term "p-i-n diode" means a diode with an undoped semiconductor region between a P-type semiconductor region and an N-type semiconductor region. In other embodiments, photodetector 280 is a GaAs, germanium (Ge), cadmium telluride (CdTe), cadmium zinc telluride (CdZnTe), gallium phosphide (GaP) or indium phosphide (InP) p-i-n diode. The heavier materials of these other photodetectors 280 provide greater sensitivity to beta and gamma radiation. In certain embodiments, photodetector 280 is removable, allowing a user to replace one photodetector 280 with another.

Radiation shielding 290 may attenuate radiation, allowing interaction to occur within a specific, "active" volume of solid-state spark chamber 200, namely SCS 220 and/or photodetector 280. This prevents radiation from damaging or interfering with the operation of other elements of solid-state spark chamber 200.

Figure 5:
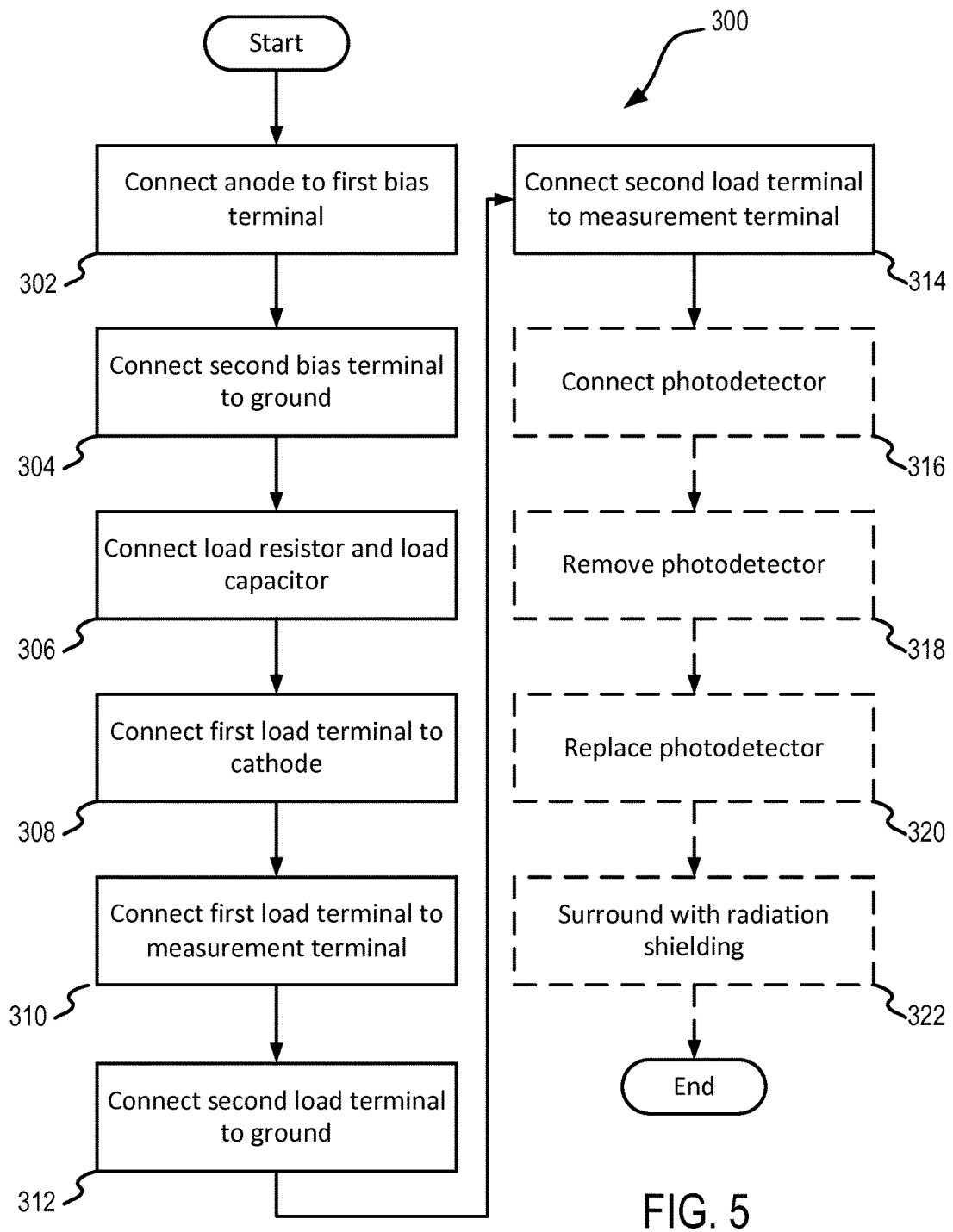
FIG. 5 illustrates a process flow diagram of a method for making a solid-state spark chamber in accordance with one embodiment of the invention.

FIG. 5 illustrates a process flow diagram of a method 300 for making solid-state spark chamber 100 or 200 in accordance with one embodiment of the invention.

In operation 302, method 300 connects anode terminal 24a/224a of CSCC 10/210 to first bias terminal 51/251 of DC bias voltage source 50/250.

In operation 304, method 300 connects second bias terminal 52/252 of DC bias voltage source 50/250 to ground 75/275.

In operation 306, method 300 connects load resistor 62/262 and load capacitor 63/263 in parallel to form RC load 60/260.

In operation 308, method 300 connects first load terminal 61/261 of RC load 60/260 to cathode terminal 24b/224b of CSCC 10/210.

In operation 310, method 300 connects first load terminal 61/261 of RC load 60/260 to one of measurement terminals 70a/270a and 70b/270b.

In operation 312, method 300 connects second load terminal 64/264 of RC load 60/260 to ground 75/275.

In operation 314, method 300 connects second load terminal 64/264 of RC load 60/260 to another of measurement terminals 70a/270a and 70b/270b.

In optional operation 316, method 300 connects photodetector 280 between ground 275 and cathode gate terminal 224d of CSCC 210.

In optional operation 318, method 300 removes photodetector 280.

In optional operation 320, method 300 replaces photodetector 280 with a different photodetector 280. This operation allows the use of multiple photodetectors 280 having different properties within the same solid-state spark chamber 200.

In optional operation 322, method 300 surrounds DC bias voltage source 250, RC load 260 and measurement terminals 270a and 270b with radiation shielding 290.

It will be understood that many additional changes in the details, materials, procedures and arrangement of parts, which have been herein described and illustrated to explain the nature of the invention, may be made by those skilled in the art within the principle and scope of the invention as expressed in the appended claims.

What is claimed is:

1. A combined semiconductor controlled circuit (CSCC) for detection of radiation, comprised of:
   a semiconductor controlled switch (SCS),
      wherein said SCS comprises an anode terminal connected to a $P_1$ anode layer, a cathode terminal connected to an $N_2$ cathode layer, an anode gate terminal connected to an $N_1$ anode gate layer, and a cathode gate terminal connected to a $P_2$ cathode gate layer
      wherein said SCS further comprises a first P-N junction between said $P_1$ anode layer and said $N_1$ anode gate layer, a second P-N junction between said $N_1$ anode gate layer and said $P_2$ cathode gate layer and a third P-N junction between said $P_2$ cathode gate layer and said $N_2$ cathode layer;
   a Zener diode having a path of current,
      wherein said Zener diode connects said cathode terminal and said anode gate terminal,
      wherein said path of current flows from said cathode terminal to said anode gate terminal;

a feedback resistor, wherein said feedback resistor connects said cathode terminal and said cathode gate terminal; and
a substrate.

2. The CSCC of claim 1,
wherein said $P_1$ anode layer is a P+ region surrounded by an N well,
wherein said $N_2$ cathode layer a N+ region surrounded by a P region surrounded by said N well,
wherein said $N_1$ anode gate layer is said N well,
wherein said $P_2$ cathode gate layer is said P region,
wherein said substrate is a silicon substrate surrounding said N well,
wherein said $N_1$ layer further comprises an N+ contact region that contacts said anode gate terminal and said $P_2$ layer further comprises a P+ contact region that contacts said cathode gate terminal.

3. The CSCC of claim 1, further comprising a control layer between said $N_1$ anode gate layer and said $P_2$ cathode gate layer,
wherein said $P_1$ anode layer is a P+ gallium arsenide (GaAs) layer,
wherein said $N_2$ cathode layer is said substrate,
wherein said $N_1$ anode gate layer is an N+ GaAs layer,
wherein said $P_2$ cathode gate layer is a P+ GaAs layer in direct contact with said substrate,
wherein said control layer is an N− GaAs layer,
wherein said substrate is an N-doped GaAs substrate.

4. The CSCC of claim 1,
wherein said $P_1$ anode layer is a P+ GaAs layer in direct contact with said substrate,
wherein said $N_2$ cathode layer is an N+ GaAs layer,
wherein said $N_1$ anode gate layer is said substrate,
wherein said $P_2$ cathode gate layer is a P+ GaAs layer in direct contact with substrate,
wherein said substrate is an N-doped GaAs substrate.

5. The CSCC of claim 1, wherein said $N_1$ anode gate layer and said $P_2$ cathode gate layer form a radiation interface directly exposed to a surrounding atmosphere.

6. The CSCC of claim 1, wherein said Zener diode is selected from the group consisting of: a diode with a quantum tunneling breakdown mechanism, a diode with an avalanche breakdown mechanism and diode with a combination of said quantum tunneling and avalanche breakdown mechanisms.

7. A solid-state spark chamber for detection of radiation, comprised of:
a CSCC;
a DC bias voltage source having a first bias terminal and a second bias terminal;
an RC load having a first load terminal and a second load terminal, wherein said RC load comprises a load resistor and a load capacitor connected in parallel;
a plurality of measurement terminals; and
a ground,
wherein said first bias terminal connects to an anode terminal of said CSCC,
wherein said second bias terminal connects to said ground,
wherein said first load terminal connects to a cathode terminal of said CSCC and to at least one of said plurality of measurement terminals,
wherein said second load terminal connects to said ground and to another of said plurality of measurement terminals.

8. The solid-state spark chamber of claim 7, wherein said CSCC has a switching voltage $V_S$ based on a magnitude of an anode gate current $I_{AG}$ injected to an anode gate terminal of said CSCC.

9. The solid-state spark chamber of claim 8, wherein said DC bias voltage source has a bias voltage $V_B$ with a maximum voltage level $V_{BM}$ based on said switching voltage $V_S$ and a switching current $I_S$.

10. The solid-state spark chamber of claim 7, wherein said load resistor has a resistance range $R_L$ based on a bias voltage $V_B$, a switching voltage $V_S$, a holding voltage $V_H$, a holding current $I_H$ and a switching current $I_S$.

11. The solid-state spark chamber of claim 7, wherein said load capacitor has a capacitance $C_L$ based on a switching time $\tau$ of said CSCC.

12. The solid-state spark chamber of claim 7, further comprising a photodetector connected between said ground and a cathode gate terminal of said CSCC.

13. The solid-state spark chamber of claim 12, wherein said photodetector is a silicon p-i-n diode.

14. The solid-state spark chamber of claim 12, wherein said photodetector is selected from the group consisting of: GaAs, germanium (Ge), cadmium telluride (CdTe), cadmium zinc telluride (CdZnTe), gallium phosphide (GaP) or indium phosphide (InP) p-i-n diodes.

15. The solid-state spark chamber of claim 12, wherein said photodetector is removable and replaceable.

16. The solid-state spark chamber of claim 7, further comprising radiation shielding surrounding said DC bias voltage source, said RC load and said plurality of measurement terminals, wherein said radiation shielding is selected from the group consisting of: lead and cadmium.

17. A method of making a solid-state spark chamber for detection of radiation comprised of:
connecting an anode terminal of a CSCC to a first bias terminal of a DC bias voltage source;
connecting a second bias terminal of said DC bias voltage source to a ground;
connecting a load resistor and a load capacitor in parallel to form an RC load;
connecting a first load terminal of said RC load to a cathode terminal of a CSCC;
connecting said first load terminal of said RC load to one of a plurality of measurement terminals;
connecting a second load terminal of said RC load to said ground;
connecting said second load terminal of said RC load to another of said plurality of measurement terminals.

18. The method of claim 17, further comprising connecting a photodetector between said ground and a cathode gate terminal of said CSCC.

19. The method of claim 18, further comprising:
removing said photodetector, and
replacing said photodetector with a different photodetector.

20. The method of claim 17, further comprising surrounding said DC bias voltage source, said RC load and said plurality of measurement terminals with radiation shielding.

* * * * *